United States Patent
Taniguchi et al.

(10) Patent No.: US 12,149,223 B2
(45) Date of Patent: Nov. 19, 2024

(54) ACOUSTIC WAVE DEVICE

(71) Applicant: Murata Manufacturing Co., Ltd., Nagaokakyo (JP)

(72) Inventors: Yasumasa Taniguchi, Nagaokakyo (JP); Takuro Okada, Nagaokakyo (JP); Munehisa Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 399 days.

(21) Appl. No.: 17/565,508

(22) Filed: Dec. 30, 2021

(65) Prior Publication Data

US 2022/0123711 A1 Apr. 21, 2022

Related U.S. Application Data (63) Continuation of application No. PCT/JP2020/025780, filed on Jul. 1, 2020.

(30) Foreign Application Priority Data

Jul. 1, 2019 (JP) .................. 2019-123236

(51) Int. Cl.
*H03H 9/02* (2006.01)

(52) U.S. Cl.
CPC .... *H03H 9/02543* (2013.01); *H03H 9/02015* (2013.01); *H03H 9/02228* (2013.01)

(58) Field of Classification Search
CPC .......... H03H 9/02543; H03H 9/02015; H03H 9/02228
See application file for complete search history.

(56) References Cited

U.S. PATENT DOCUMENTS

| | | | | |
|---|---|---|---|---|
| 2014/0145558 A1* | 5/2014 | Hori | ...... | H10N 30/072 |
| | | | | 310/313 R |
| 2015/0102705 A1* | 4/2015 | Iwamoto | ............ | H03H 9/02574 |
| | | | | 310/313 B |
| 2017/0033765 A1* | 2/2017 | Moriya | .............. | H03H 9/02574 |

(Continued)

FOREIGN PATENT DOCUMENTS

| | | |
|---|---|---|
| JP | 2010-161697 A | 7/2010 |
| JP | 2015-115870 A | 6/2015 |

(Continued)

OTHER PUBLICATIONS

Official Communication issued in International Patent Application No. PCT/JP2020/025780, mailed on Aug. 25, 2020.

*Primary Examiner* — Samuel S Outten
(74) *Attorney, Agent, or Firm* — Keating & Bennett, LLP (57) ABSTRACT

An acoustic wave device includes a silicon substrate, a piezoelectric layer, and an IDT electrode. Each of the silicon substrate and the piezoelectric layer includes first and second opposed main surfaces. The IDT electrode is on the first main surface of the piezoelectric layer, and includes first and second electrode fingers. When a wavelength of an acoustic wave determined by an electrode finger pitch of the IDT electrode is denoted as $\lambda$, a distance between the first main surface of the silicon substrate and the second main surface of the piezoelectric layer in a thickness direction of the silicon substrate is less than about $0.84\lambda$. The first main surface of the silicon substrate is rougher than the first main surface of the piezoelectric layer.

20 Claims, 7 Drawing Sheets

(56) References Cited

U.S. PATENT DOCUMENTS

| | | |
|---|---|---|
| 2018/0034439 A1* | 2/2018 | Ruby ................ H03H 9/02574 |
| 2019/0036008 A1 | 1/2019 | Tai et al. |
| 2019/0280666 A1 | 9/2019 | Akiyama et al. |
| 2019/0288661 A1 | 9/2019 | Akiyama et al. |
| 2019/0372552 A1 | 12/2019 | Gaudin et al. |
| 2019/0393856 A1 | 12/2019 | Iwamoto et al. |

FOREIGN PATENT DOCUMENTS

| | | |
|---|---|---|
| WO | 2017/163723 A1 | 9/2017 |
| WO | 2018/002504 A1 | 1/2018 |
| WO | 2018/016169 A1 | 1/2018 |
| WO | 2018/016314 A1 | 1/2018 |
| WO | 2018/163805 A1 | 9/2018 |

* cited by examiner

ACOUSTIC WAVE DEVICE

CROSS REFERENCE TO RELATED APPLICATIONS

This application claims the benefit of priority to Japanese Patent Application No. 2019-123236 filed on Jul. 1, 2019 and is a Continuation Application of PCT Application No. PCT/JP2020/025780 filed on Jul. 1, 2020. The entire contents of each application are hereby incorporated herein by reference.

BACKGROUND OF THE INVENTION

1. Field of the Invention

The present invention relates to an acoustic wave device, and more particularly to an acoustic wave device including a silicon substrate.

2. Description of the Related Art

As an acoustic wave device, there has been known a surface acoustic wave element including a piezoelectric substrate, a pair of comb-shaped electrodes provided on a surface of the piezoelectric substrate, and a silicon substrate bonded to the piezoelectric substrate (for example, see Japanese Unexamined Patent Application Publication No. 2010-161697).

The silicon substrate has a rough back surface to scatter a bulk wave that has propagated from the piezoelectric substrate in the surface acoustic wave element described in Japanese Unexamined Patent Application Publication No. 2010-161697.

For an acoustic wave device including a silicon substrate, harmonic distortion may be a problem in a case in which a distance between the silicon substrate and a piezoelectric layer is short.

SUMMARY OF THE INVENTION

Preferred embodiments of the present invention provide acoustic wave devices that are each able to reduce or prevent harmonic distortion.

An acoustic wave device according to a preferred embodiment of the present invention includes a silicon substrate, a piezoelectric layer, and an IDT electrode. The silicon substrate includes a first main surface and a second main surface opposed to each other. The piezoelectric layer includes a first main surface and a second main surface opposed to each other. The piezoelectric layer is on or above the first main surface of the silicon substrate. The IDT electrode is on the first main surface of the piezoelectric layer. The IDT electrode includes a plurality of first electrode fingers and a plurality of second electrode fingers. The first main surface of the piezoelectric layer is opposite to a side of the silicon substrate. The second main surface of the piezoelectric layer is on a side of the silicon substrate. When a wavelength of an acoustic wave determined by an electrode finger pitch of the IDT electrode is denoted as $\lambda$, a distance between the first main surface of the silicon substrate and the second main surface of the piezoelectric layer in a thickness direction of the silicon substrate is less than about $0.84\lambda$. The first main surface of the silicon substrate is rougher than the first main surface of the piezoelectric layer.

Acoustic wave devices according to preferred embodiments of the present invention are each able to reduce or prevent harmonic distortion.

The above and other elements, features, steps, characteristics and advantages of the present invention will become more apparent from the following detailed description of the preferred embodiments with reference to the attached drawings.

DETAILED DESCRIPTION OF THE EMBODIMENTS

All of FIGS. 1, 2, 4, and 6 referred to in the following preferred embodiments and the like are schematic diagrams, and ratios of sizes and thicknesses of elements in the diagrams do not necessarily reflect actual dimensional ratios.

Preferred Embodiment 1

(1) Overall Configuration of Acoustic Wave Device

Hereinafter, an acoustic wave device 1 according to Preferred Embodiment 1 of the present invention will be described with reference to FIGS. 1 and 2.

The acoustic wave device 1 includes a silicon substrate 2, a piezoelectric layer 4, and an interdigital transducer (IDT) electrode 5. The piezoelectric layer 4 is provided on or above the silicon substrate 2. The IDT electrode 5 is provided on the piezoelectric layer 4. The acoustic wave device 1 further includes two reflectors 6 (see FIG. 2). The two reflectors 6 are provided on the piezoelectric layer 4. One of the two reflectors 6 is positioned on one side of the IDT electrode 5, and the other of the two reflectors 6 is positioned on the other side of the IDT electrode 5 along a propagation direction of an acoustic wave in the acoustic wave device 1. The acoustic wave device 1 further includes a wiring portion 7 connected to the IDT electrode 5. The wiring portion 7 is provided on the piezoelectric layer 4.

The acoustic wave device 1 further includes a dielectric film 3 provided between the silicon substrate 2 and the piezoelectric layer 4. The dielectric film 3 includes a low acoustic velocity film 31. The dielectric film 3 further includes a high acoustic velocity film 32 provided between the silicon substrate 2 and the low acoustic velocity film 31.

In the acoustic wave device 1, one IDT electrode 5 is provided on the piezoelectric layer 4. However, the number of IDT electrodes 5 is not limited to one and may be plural. In a case that the acoustic wave device 1 includes a plurality of IDT electrodes 5, a band pass filter may be provided such that surface acoustic wave resonators each including the plurality of IDT electrodes 5 are electrically connected, for example.

(2) Elements of Acoustic Wave Device

(2.1) Silicon Substrate

Figure 1:
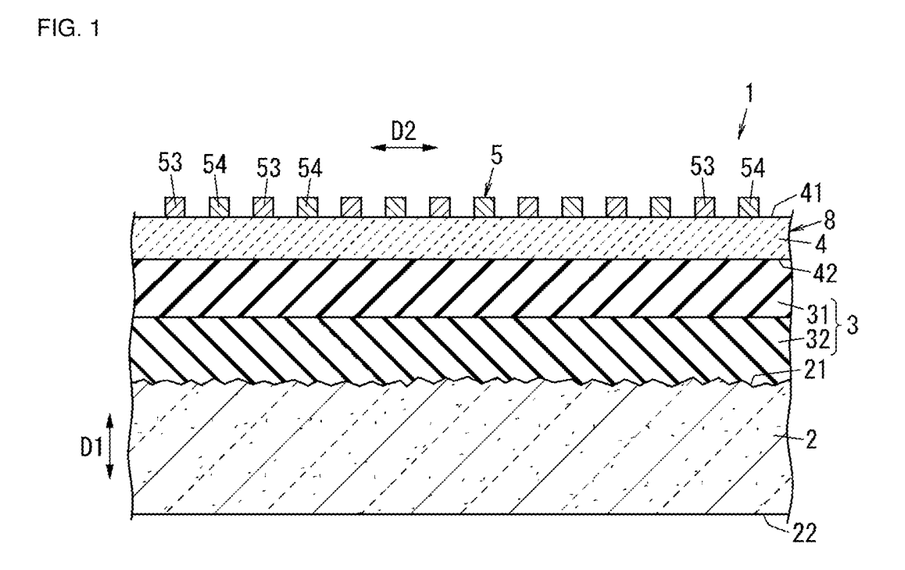
FIG. 1 is a sectional view of an acoustic wave device according to Preferred Embodiment 1 of the present invention.

The silicon substrate 2 supports a multilayer body 8 including the dielectric film 3, the piezoelectric layer 4, and the IDT electrode 5 as illustrated in FIG. 1.

The silicon substrate 2 includes a first main surface 21 and a second main surface 22 opposed to each other. The first main surface 21 and the second main surface 22 are opposed to each other in a thickness direction D1 of the silicon substrate 2. The silicon substrate 2 has a rectangular or substantially rectangular shape in plan view from the thickness direction D1 of the silicon substrate 2, but is not limited thereto, and may have a square or substantially square shape, for example.

The thickness of the silicon substrate 2 is preferably, for example, about 10λ (λ: wavelength of an acoustic wave determined by an electrode finger pitch P1) or more and about 180 μm or less; and is about 120 μm, as an example. The plane orientation of the first main surface 21 of the silicon substrate 2 is a (100) plane, for example, but is not limited thereto, and may be a (110) plane, a (111) plane, or the like, for example. The propagation direction of the acoustic wave may be determined without being restricted by the plane orientation of the silicon substrate 2.

(2.2) Piezoelectric Layer

The piezoelectric layer 4 includes a first main surface 41 and a second main surface 42 opposed to each other. The first main surface 41 and the second main surface 42 are opposed to each other in the thickness direction D1 of the silicon substrate 2.

The piezoelectric layer 4 is made of a Γ° Y-cut X-propagation LiTaO$_3$ piezoelectric single crystal, for example. An axis is rotated by Γ° from a Y-axis to a Z-axis with an X-axis as a center axis when three crystal axes of a LiTaO$_3$ piezoelectric single crystal are defined as the X-axis, the Y-axis, and the Z-axis. The Γ° Y-cut X-propagation LiTaO$_3$ piezoelectric single crystal is obtained by cutting a LiTaO$_3$ piezoelectric single crystal along the plane of which normal line is the axis above, and is a single crystal where a surface acoustic wave propagates in an X-axis direction. When cut-angles are denoted as Γ [°] and Euler angles of the piezoelectric layer 4 are denoted as (φ, θ, ψ), the cut-angles of the piezoelectric layer 4 are expressed as Γ=θ+90°. Note that, Γ and Γ±180×n have the same meaning. Here, n is a natural number. The piezoelectric layer 4 is not limited to the Γ° Y-cut X-propagation LiTaO$_3$ piezoelectric single crystal, and may be a Γ° Y-cut X-propagation LiTaO$_3$ piezoelectric ceramics, for example.

The thickness of the piezoelectric layer 4 is, for example, about 3.5λ or less when the wavelength of the acoustic wave determined by the electrode finger pitch (electrode finger period) P1 of the IDT electrode 5 is denoted as λ. The electrode finger pitch P1 will be described later in the section "(2.3) IDT electrode". When the thickness of the piezoelectric layer 4 is about 3.5λ or less, a Q factor of the acoustic wave device 1 increases. Further, setting the thickness of the piezoelectric layer 4 to about 2.5λ or less makes it possible to reduce a temperature coefficient of frequency (TCF). Furthermore, setting the thickness of the piezoelectric layer 4 to about 1.5λ or less makes it easy to adjust the acoustic velocity of the acoustic wave. Note that the thickness of the piezoelectric layer 4 is not limited to about 3.5λ or less, and may be greater than about 3.5λ. The wavelength of the acoustic wave is about 2.0 μm in the acoustic wave device 1 according to Preferred Embodiment 1, for example.

When the thickness of the piezoelectric layer 4 is about 3.5λ or less, the Q factor of the acoustic wave device 1 increases as described above, but a high-order mode is generated. In the acoustic wave device 1, the above-described dielectric film 3 is provided to reduce the high-order mode even when the thickness of the piezoelectric layer 4 is about 3.5λ or less. The dielectric film 3 will be described later in the section "(2.6) Dielectric film".

In the acoustic wave device 1, as a mode of the acoustic wave propagating along the piezoelectric layer 4, for example, a longitudinal wave, an SH wave, or a shear vertical (SV) wave, or a mode in which these waves are combined may be used. In the acoustic wave device 1, for example, the mode with an SH wave as a main component is used as a main mode. The high-order mode is a spurious mode generated on a higher frequency side relative to the main mode of an acoustic wave propagating along the piezoelectric layer 4. Whether or not the mode of the acoustic wave propagating along the piezoelectric layer 4 is "the main mode having an SH wave as a main component" may be confirmed as follows, for example. A displacement distribution is analyzed by a finite element method using such as parameters (such as a material, Euler angles, and a thickness) of the piezoelectric layer 4, parameters (such as a material, a thickness, and an electrode finger pitch) of the IDT electrode 5, and parameters (such as a material and a thickness) of the low acoustic velocity film 31. Then strain is analyzed. The Euler angles of the piezoelectric layer 4 may be obtained by analysis.

The material for the piezoelectric layer 4 is not limited to lithium tantalate (LiTaO$_3$), and may be lithium niobate (LiNbO$_3$), zinc oxide (ZnO), aluminum nitride (AlN), or lead zirconate titanate (PZT), for example. For example, in a case that the piezoelectric layer 4 is made of a Y-cut X-propagation LiNbO$_3$ piezoelectric single crystal or a piezoelectric ceramics, using a Love wave as the acoustic wave makes it possible in the acoustic wave device 1 to use the mode of which main component is an SH wave as the main mode. The single crystal material and the cut-angles of the piezoelectric layer 4 may be appropriately determined in accordance with required specifications of a filter (a filter characteristic such as a bandpass characteristic, an attenuation characteristic, temperature characteristics, and a band width), for example.

(2.3) IDT Electrode

The IDT electrode 5 is provided on the piezoelectric layer 4. More specifically, the IDT electrode 5 is provided on the piezoelectric layer 4 on the first main surface 41 opposite to the second main surface 42 on the side of the silicon substrate 2.

Figure 2:
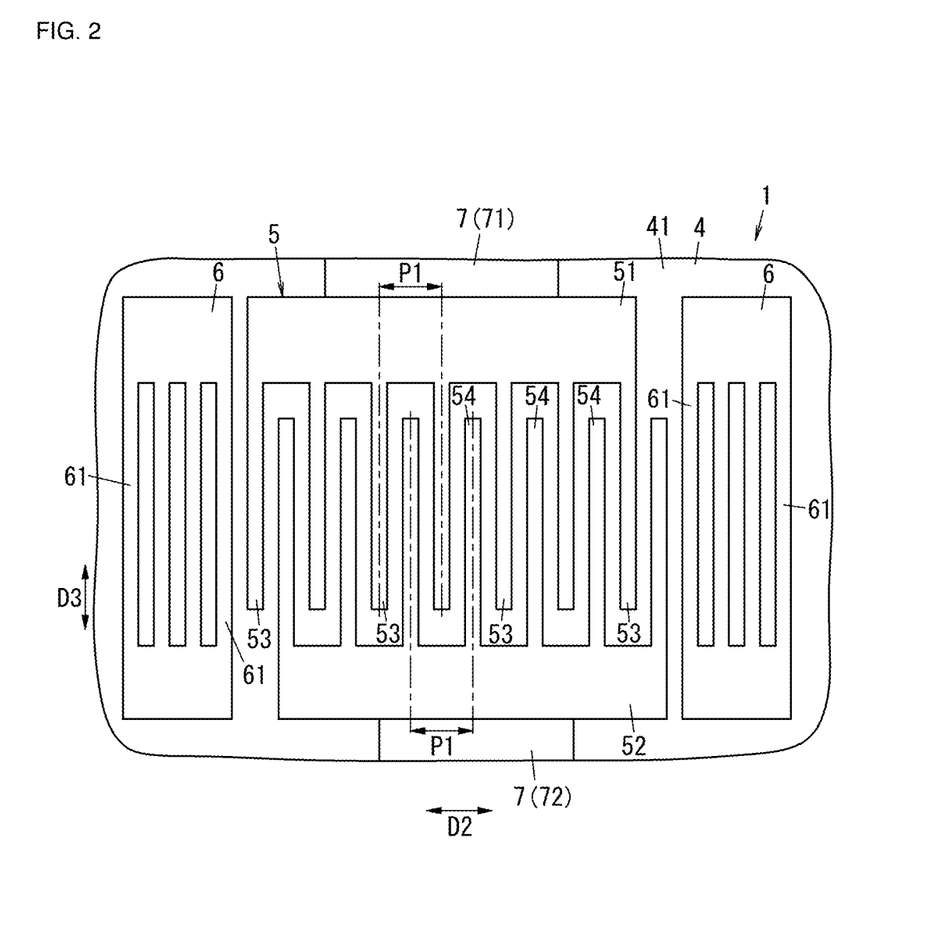
FIG. 2 is a plan view of the acoustic wave device according to Preferred Embodiment 1 of the present invention.

The IDT electrode 5 includes a first busbar 51, a second busbar 52, a plurality of first electrode fingers 53, and a plurality of second electrode fingers 54, as illustrated in FIG. 2. The second busbar 52 faces the first busbar 51.

The plurality of first electrode fingers 53 are connected to the first busbar 51 and extend toward a side of the second busbar 52. The plurality of first electrode fingers 53 are integral with the first busbar 51 and are separated from the second busbar 52.

The plurality of second electrode fingers 54 are connected to the second busbar 52 and extend toward a side of the first busbar 51. The plurality of second electrode fingers 54 are integral with the second busbar 52, and are separated from the first busbar 51.

The IDT electrode 5 is a normal IDT electrode. Hereinafter, the IDT electrode 5 will be described in more detail.

The first busbar 51 and the second busbar 52 of the IDT electrode 5 have an elongated shape whose longitudinal direction is a second direction D2 orthogonal or substantially orthogonal to the thickness direction D1 (first direction) of the silicon substrate 2. In the IDT electrode 5, the first busbar 51 and the second busbar 52 face each other in a third direction D3 orthogonal or substantially orthogonal to both the thickness direction D1 and the second direction D2 of the silicon substrate 2.

The plurality of first electrode fingers 53 are connected to the first busbar 51 and extend toward the second busbar 52. Here, the plurality of first electrode fingers 53 extend from the first busbar 51 along the third direction D3. The tips of the plurality of first electrode fingers 53 are separated from the second busbar 52. For example, the first electrode fingers 53 have the same or substantially the same length and the same or substantially the same width as each other.

The plurality of second electrode fingers 54 are connected to the second busbar 52 and extend toward the first busbar 51. Here, the plurality of second electrode fingers 54 extend from the second busbar 52 along the third direction D3. The tip of each of the plurality of second electrode fingers 54 is separated from the first busbar 51. For example, the second electrode fingers 54 have the same or substantially the same length and the same or substantially the same width as each other. In the example of FIG. 2, the length and the width of the plurality of second electrode fingers 54 are the same or substantially the same as the length and the width of the plurality of first electrode fingers 53, respectively.

In the IDT electrode 5, each of the first electrode fingers 53 and each of the second electrode fingers 54 are alternately arranged one by one with a distance from each other in the second direction D2. Accordingly, the adjacent first electrode finger 53 and second electrode finger 54 are separated from each other. The first busbar 51 is a conductor portion to make the first electrode fingers 53 have the same electric potential. The second busbar 52 is a conductor portion to make the second electrode fingers 54 have the same electric potential (equipotential).

The IDT electrode 5 includes an overlap region determined by the plurality of first electrode fingers 53 and the plurality of second electrode fingers 54. The overlap region is the region between an envelope of the tips of the plurality of first electrode fingers 53 and an envelope of the tips of the plurality of second electrode fingers 54. The IDT electrode 5 excites an acoustic wave in the overlap region.

The IDT electrode 5 is a normal IDT electrode, but is not limited thereto. For example, the IDT electrode 5 may be an apodized weighted IDT electrode or an inclined IDT electrode. In the apodized weighted IDT electrode, an overlap width increases from one end portion toward the center in the propagation direction of an acoustic wave, and decreases from the center toward the other end portion in the propagation direction of an acoustic wave.

The electrode finger pitch P1 of the IDT electrode 5 is defined by a distance between the center lines of the two adjacent first electrode fingers 53 in the plurality of first electrode fingers 53, or a distance between the center lines of the two adjacent second electrode fingers 54 in the plurality of second electrode fingers 54, as illustrated in FIG. 2. The distance between the center lines of the two adjacent second electrode fingers 54 is the same or substantially the same as the distance between the center lines of the two adjacent first electrode fingers 53.

In the IDT electrode 5 of the acoustic wave device 1 according to Preferred Embodiment 1, the number of pairs of the first electrode finger 53 and the second electrode finger 54 is 100, as an example. That is, the IDT electrode 5 includes the 100 first electrode fingers 53 and the 100 second electrode fingers 54, as an example.

The IDT electrode 5 has electrical conductivity. The material for the IDT electrode 5 is Al (aluminum), Cu (copper), Pt (platinum), Au (gold), Ag (silver), Ti (titanium), Ni (nickel), Cr (chromium), Mo (molybdenum), W (tungsten), Ta (tantalum), Mg (magnesium), Fe (iron), or an alloy including any of these metals as a main body, for example. Further, the IDT electrode 5 may have a structure in which metal films made of these metals or alloys are laminated. The IDT electrode 5 includes a multilayer film including an adhesion film made of a Ti film on the piezoelectric layer 4, and a main electrode film made of an Al film on the adhesion film, for example. Note that the IDT electrode 5 may include a metal film on the main electrode film in each of the first busbar 51 and the second busbar 52 from the viewpoint of reducing the resistance of the first busbar 51 and the second busbar 52.

(2.4) Reflector

In the acoustic wave device 1, the two reflectors 6 are provided on the first main surface 41 of the piezoelectric layer 4. Each of the two reflectors 6 (see FIG. 2) is a short-circuited grating, for example. Each reflector 6 reflects an acoustic wave.

Each of the two reflectors 6 has a plurality of electrode fingers 61, and one ends of the plurality of electrode fingers 61 are short-circuited to each other and the other ends are short-circuited to each other. In each of the two reflectors 6, the number of the electrode fingers 61 is 20, as an example.

Each of the two reflectors 6 has electrical conductivity. The material for each reflector 6 is Al, Cu, Pt, Au, Ag, Ti, Ni, Cr, Mo, W, Ta, Mg, Fe, or an alloy including any of these metals as a main body, for example. Further, each reflector 6 may have a structure in which metal films made of these metals or alloys are laminated. Each reflector 6 includes a multilayer film including an adhesion film made of a Ti film on the piezoelectric layer 4, and a main electrode film made of an Al film on the adhesion film, for example.

In the acoustic wave device 1, in a case in which the reflectors 6 and the IDT electrode 5 are made of the same material and are set to have the same or substantially the same thickness, it is possible to form the reflectors 6 and the IDT electrode 5 in the same process at the time of manufacturing the acoustic wave device 1.

In the acoustic wave device 1, each reflector 6 is a short-circuited grating, but is not limited thereto, and may be an open grating, a positive/negative reflection grating, or the like, for example.

(2.5) Wiring Portion

In the acoustic wave device 1, the wiring portion 7 is provided on the first main surface 41 of the piezoelectric layer 4, as illustrated in FIG. 2.

The material for the wiring portion 7 is Al, Cu, Pt, Au, Ag, Ti, Ni, Cr, Mo, W, Ta, Mg, Fe, or an alloy including any of these metals as a main body, for example. Further, the wiring portion 7 may have a structure in which metal films made of these metals or alloys are laminated.

The wiring portion 7 includes a first wiring portion 71 connected to the first busbar 51 of the IDT electrode 5, and a second wiring portion 72 connected to the second busbar 52 of the IDT electrode 5.

The first wiring portion 71 extends from the first busbar 51 to a side opposite to a side of the plurality of first electrode fingers 53. The first wiring portion 71 may partially overlap with the first busbar 51 in the thickness direction D1 of the silicon substrate 2, or may be integrally provided with the first busbar 51 with the same material and the same or substantially the same thickness as the first busbar 51. Further, the first wiring portion 71 may include a metal film integrally provided with the first busbar 51 and another metal film provided on the metal film.

The second wiring portion 72 extends from the second busbar 52 to a side opposite to a side of the plurality of second electrode fingers 54. The second wiring portion 72 may partially overlap with the second busbar 52 in the thickness direction D1 of the silicon substrate 2, or may be integrally provided with the second busbar 52 with the same material and the same or substantially the same thickness as the second busbar 52. Further, the second wiring portion 72 may include a metal film integrally provided with the second busbar 52 and another metal film provided on the metal film.

The acoustic wave device 1 may further include a first terminal connected to the first busbar 51 with the first wiring portion 71 interposed therebetween, and a second terminal connected to the second busbar 52 with the second wiring portion 72 interposed therebetween. Further, the acoustic wave device 1 may further include two third wiring portions each connected to each of the two reflectors 6. In this case, each of the two reflectors 6 may be connected to the second terminal via at least the third wiring portion. In the acoustic wave device 1, a plurality of external connection terminals including the first terminal, the second terminal, and a third terminal is the electrode to electrically connect to a circuit substrate, a mounting substrate (submount substrate) for packaging, or the like. The acoustic wave device 1 may further include a plurality of dummy terminals not electrically connected to the IDT electrode 5. The plurality of dummy terminals are provided to increase the parallelism of the acoustic wave device 1 to a circuit substrate, a mounting substrate, or the like, and is different from the terminal for electrical connection. That is, the dummy terminal reduces or prevents mounting of the acoustic wave device 1 on a circuit substrate, a mounting substrate, or the like in an inclined manner, and is not necessarily provided depending on conditions such as, for example, the number and arrangement of the external connection terminals, and the outer peripheral shape of the acoustic wave device 1.

(2.6) Dielectric Film

In the acoustic wave device 1 according to Preferred Embodiment 1, the dielectric film 3 includes the low acoustic velocity film 31 and the high acoustic velocity film 32, as described above.

The low acoustic velocity film 31 is a film in which the acoustic velocity of a bulk wave propagating along the low acoustic velocity film 31 is lower than the acoustic velocity of a bulk wave propagating along the piezoelectric layer 4. In the silicon substrate 2, the acoustic velocity of a bulk wave propagating along the silicon substrate 2 is higher than the acoustic velocity of an acoustic wave propagating along the piezoelectric layer 4. Here, a bulk wave propagating along the silicon substrate 2 is the bulk wave having the lowest acoustic velocity in a plurality of bulk waves propagating along the silicon substrate 2.

In the acoustic wave device 1 according to Preferred Embodiment 1, the low acoustic velocity film 31 is provided between the silicon substrate 2 and the piezoelectric layer 4. Since the low acoustic velocity film 31 is provided between the silicon substrate 2 and the piezoelectric layer 4, the acoustic velocity of an acoustic wave decreases. An acoustic wave inherently has a property that energy is concentrated in the medium having a low acoustic velocity. Accordingly, it is possible to improve the effect of confining the energy of an acoustic wave in the piezoelectric layer 4 and the IDT electrode 5 in which the acoustic wave is excited. As a result, it is possible to reduce loss and increase the Q factor in comparison with a case that the low acoustic velocity film 31 is not provided.

The material for the low acoustic velocity film 31 is silicon oxide, for example. The material for the low acoustic velocity film 31 is not limited to silicon oxide. The material for the low acoustic velocity film 31 may be silicon oxide, glass, silicon oxynitride, tantalum oxide, a compound obtained by adding fluorine, carbon, or boron to silicon oxide, or a material including any of the above materials as a main component, for example.

In a case in which the low acoustic velocity film is silicon oxide, the temperature characteristics of the acoustic wave device 1 may be improved. An elastic constant of lithium tantalate has negative temperature characteristics, and an elastic constant of silicon oxide has positive temperature characteristics. Accordingly, an absolute value of the TCF of the acoustic wave device 1 may be reduced.

The thickness of the low acoustic velocity film 31 is preferably, for example, about $2.0\lambda$ or less, when the wavelength of the acoustic wave determined by the electrode finger pitch P1 described above is denoted as $\lambda$. The thickness of the low acoustic velocity film 31 is about 670 nm, for example. Setting the thickness of the low acoustic velocity film to about $2.0\lambda$ or less makes it possible to reduce film stress. As a result, it is possible to reduce the warpage of a silicon wafer from which the silicon substrate 2 is formed at the time of manufacturing the acoustic wave device 1, and a non-defective rate may be improved and characteristics may be stabilized.

The high acoustic velocity film 32 is provided between the silicon substrate 2 and the low acoustic velocity film 31. Here, the high acoustic velocity film 32 is directly provided on the first main surface 21 of the silicon substrate 2. The high acoustic velocity film 32 is a film in which the acoustic velocity of a bulk wave propagating along the high acoustic velocity film is higher than the acoustic velocity of an acoustic wave propagating along the piezoelectric layer 4. The thickness of the high acoustic velocity film 32 is about 200 nm, about 300 nm, or about 400 nm, for example.

The high acoustic velocity film 32 reduces or prevents leakage of the energy of an acoustic wave that is the main mode to the structure below the high acoustic velocity film 32. In the acoustic wave device 1, when the thickness of the high acoustic velocity film 32 is sufficiently large, the energy of the acoustic wave that is the main mode is distributed to the entire or substantially the entire piezoelectric layer 4 and the low acoustic velocity film 31, and to a portion of the high acoustic velocity film 32 on the side of the low acoustic velocity film 31 and the energy of the acoustic wave that is the main mode is not distributed to the silicon substrate 2. The mechanism of confining an acoustic wave by the high acoustic velocity film 32 is the same as or similar to that of a Love wave type surface acoustic wave that is a non-leaky SH wave, and is described in a document "Introduction to Simulation Technologies for Surface Acoustic Wave Devices", Hashimoto Kenya, REALIZE Science & Engineering, pp. 26-28, for example. The above-described mechanism is different from a mechanism of confining an acoustic wave using a Bragg reflector made of an acoustic multilayer film.

The material for the high acoustic velocity film 32 is at least one material selected from the group consisting of diamond-like carbon, aluminum nitride, aluminum oxide, silicon carbide, silicon nitride, silicon, sapphire, a piezoelectric body (lithium tantalate, lithium niobate, or crystal), alumina, zirconia, cordierite, mullite, steatite, forsterite, magnesia, and diamond, for example. The material for the high acoustic velocity film 32 may be, for example, a material including any of the above-described materials as a main component, or a material including a mixture that includes any of the above-described materials as a main component.

(3) Surface Roughness of First Main Surface of Silicon Substrate

In the acoustic wave device 1, the first main surface 21 of the silicon substrate 2 is rougher than the first main surface 41 of the piezoelectric layer 4. Here, the surface roughness of the first main surface 21 of the silicon substrate 2 is about 20 nm or more in maximum height roughness, for example. It is preferable that the maximum height roughness of the first main surface 21 of the silicon substrate 2 is larger from the viewpoint of reducing or preventing harmonic distortion (third harmonic distortion, for example). Whereas, it is preferable that the maximum height roughness of the first main surface 21 of the silicon substrate 2 is small from the viewpoint of bondability, in a case in which the following manufacturing process is used. In the manufacturing process, a piezoelectric substrate from which the piezoelectric layer 4 is formed is bonded to the side of the first main surface 21 of the silicon substrate 2, for example. The surface roughness of the first main surface 21 of the silicon substrate 2 is preferably about 150 nm or less, and more preferably about 80 nm or less in maximum height roughness, for example. With regard to the surface roughness, the maximum height roughness is a value measured from a scanning transmission electron microscope (STEM) image when a sample of the acoustic wave device 1 is observed under STEM image. The magnification of the STEM image when measuring the maximum height roughness is about 80000 times, for example. The maximum height roughness is the sum of the maximum value of a peak height and the maximum value of a valley depth of the first main surface 21 of the silicon substrate 2 in the STEM image. That is, the maximum height roughness is a value of Peak to Valley of the unevenness of the first main surface 21. It is possible to vary the surface roughness of the first main surface 21 of the silicon substrate 2 with the condition of the process of roughening that is performed by etching, sandblasting, or the like at the time of manufacturing, for example. For discussing a relative magnitude relationship of the surface roughness, the surface roughness is not limited to the value obtained from the STEM image, and may be the value obtained from an SEM image, for example.

(4) Characteristics of Acoustic Wave Device

Figure 3:
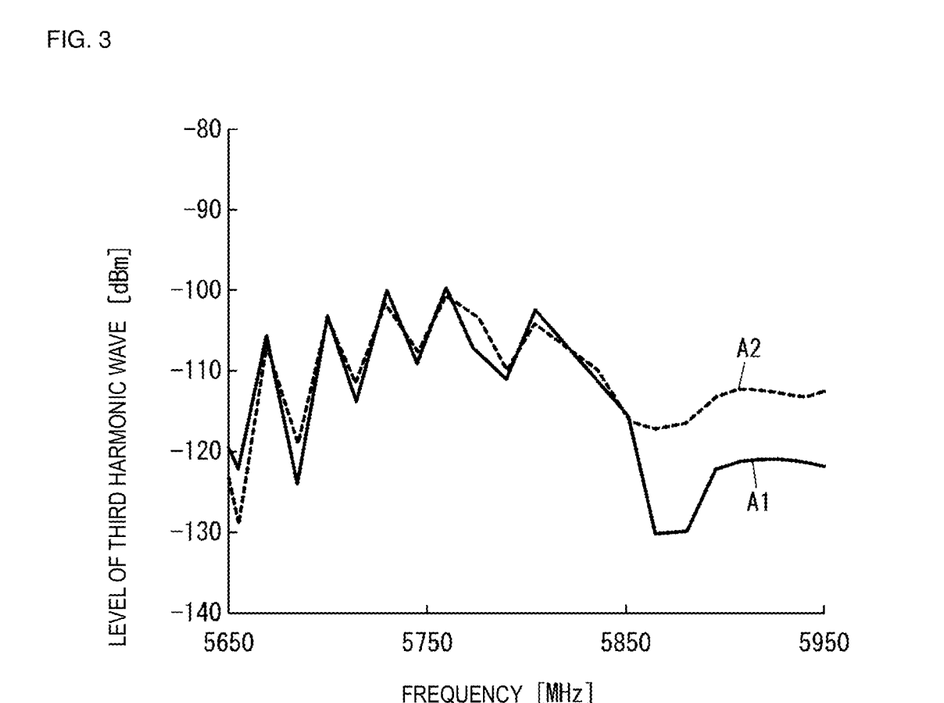
FIG. 3 is a characteristics diagram of the acoustic wave device according to Preferred Embodiment 1 of the present invention and an acoustic wave device of a comparative example.
Figure 4:
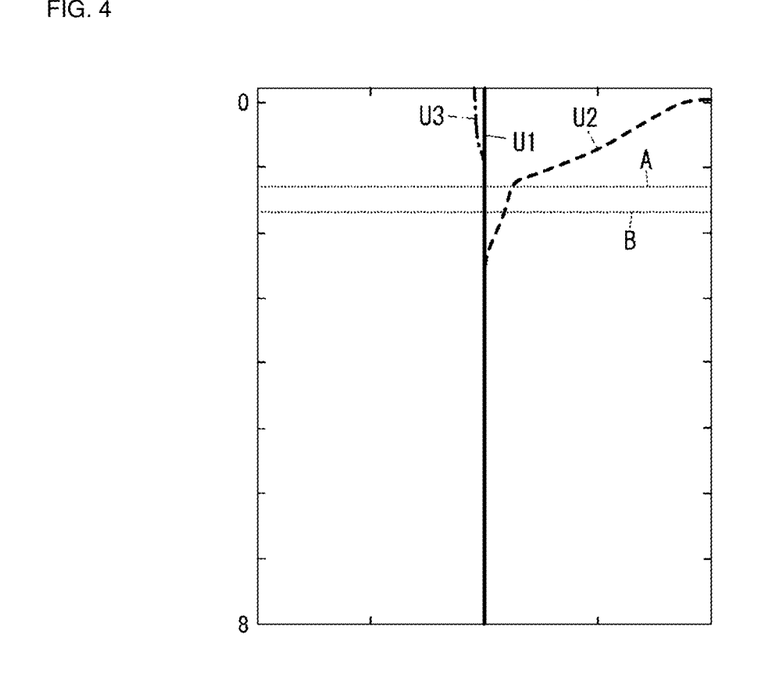
FIG. 4 is a schematic diagram of energy distribution of a shear horizontal (SH) wave, that is a U2 component, which is a main mode of the acoustic wave device when a film thickness of a high acoustic velocity film is about $0.2\lambda$.

FIG. 3 illustrates the waveform of a third harmonic wave when about +15 dBm electric power is inputted to each of the acoustic wave device 1 according to Preferred Embodiment 1 and the acoustic wave device according to a comparative example. In FIG. 3, the horizontal axis represents frequency, and the vertical axis represents the level of the third harmonic wave [dBm]. In FIG. 3, the waveform of the third harmonic wave of the acoustic wave device 1 according to Preferred Embodiment 1 is indicated by a solid line A1, and the waveform of the third harmonic wave of the acoustic wave device according to the comparative example is indicated by a broken line A2. Main structural parameters of the acoustic wave device 1 according to Preferred Embodiment 1 are as follows. The structural parameters of the acoustic wave device 1 according to Preferred Embodiment 1 differ from the structural parameters of the acoustic wave device according to the comparative example as follows. The first main surface 21 of the silicon substrate 2 of the acoustic wave device 1 according to Preferred Embodiment 1 is roughened from a mirror surface at the time of manufacturing (in other words, the surface roughness of the first main surface 21 of the silicon substrate 2 is increased more than the surface roughness of the first main surface 41 of the piezoelectric layer 4). Whereas, the first main surface 21 of the silicon substrate 2 of the acoustic wave device according to the comparative example is not roughened from the mirror surface (in other words, the surface roughness of the first main surface 21 of the silicon substrate 2 is equal or substantially equal to or less than the surface roughness of the first main surface 41 of the piezoelectric layer 4). For example, in the acoustic wave device, in a case in which the distance between the first main surface 21 of the silicon substrate 2 and the piezoelectric layer 4 in the thickness direction D1 of the silicon substrate 2 is short (less than about 0.84λ, for example), the harmonic distortion is significantly generated.

Structural Parameters

Material for piezoelectric layer 4: lithium tantalate
    Thickness of piezoelectric layer 4: about 0.3λ
    Material for low acoustic velocity film 31: silicon oxide
    Thickness of low acoustic velocity film 31: about 0.335λ
    Material for high acoustic velocity film 32: silicon nitride
    Thickness of high acoustic velocity film 32: about 0.45λ
    Wavelength λ of surface acoustic wave: about 2.0 μm
    Material for main electrode film in IDT electrode 5: aluminum
    Material for adhesion film in IDT electrode 5: titanium
    Thickness of IDT electrode 5: about 0.0725λ
    Resonant frequency: about 1884 MHz
    Anti-resonant frequency: about 1951 MHz
    Distance between first main surface 21 of silicon substrate 2 and piezoelectric layer 4: about 0.785λ

Surface roughness of first main surface 41 of piezoelectric layer 4: about 10 nm or less in maximum height roughness Surface roughness of first main surface 21 of silicon substrate 2: about 38 nm in maximum height roughness Surface roughness of second main surface 22 of silicon substrate 2: measurement limit or less in STEM image at about 80000 times magnification From the results in FIG. 3, it is seen that the acoustic wave device 1 according to Preferred Embodiment 1 is able to reduce the level of the third harmonic wave in the frequency band of about 5850 MHz or higher in comparison with the acoustic wave device according to the comparative example.

Each of FIGS. 4 to 7 depicts the energy distribution of acoustic waves that are the main mode in a case that the high acoustic velocity film 32 in the acoustic wave device 1 is made of an aluminum nitride film, and when the film thickness of the high acoustic velocity film 32 is about 0.2λ, about 0.5λ, about 1.0λ, and about 3.0λ, respectively. In each of FIGS. 4 to 7, U1 means an acoustic wave having a P wave as a main component, U2 means an acoustic wave having an SH wave as a main component, and U3 means an acoustic wave having an SV wave as a main component. The P wave is a longitudinal wave. The S wave is a transversal wave. The acoustic wave used in a structural portion of the acoustic wave device 1 above the high acoustic velocity film 32 is the U2 component in FIGS. 4 to 7, that is, the SH wave. The structural portion of the acoustic wave device 1 above the high acoustic velocity film 32 includes the low acoustic velocity film 31 and the piezoelectric layer 4. In each of FIGS. 4 to 7, the vertical direction in the figure is the thickness direction of the acoustic wave device 1. In each of FIGS. 4 to 7, a dotted line A indicates a position of the upper surface (surface in contact with low acoustic velocity film 31) of the high acoustic velocity film 32, and a dotted line B indicates a position of the lower surface (surface opposite to the surface in contact with low acoustic velocity film 31) of the high acoustic velocity film 32.

Figure 5:
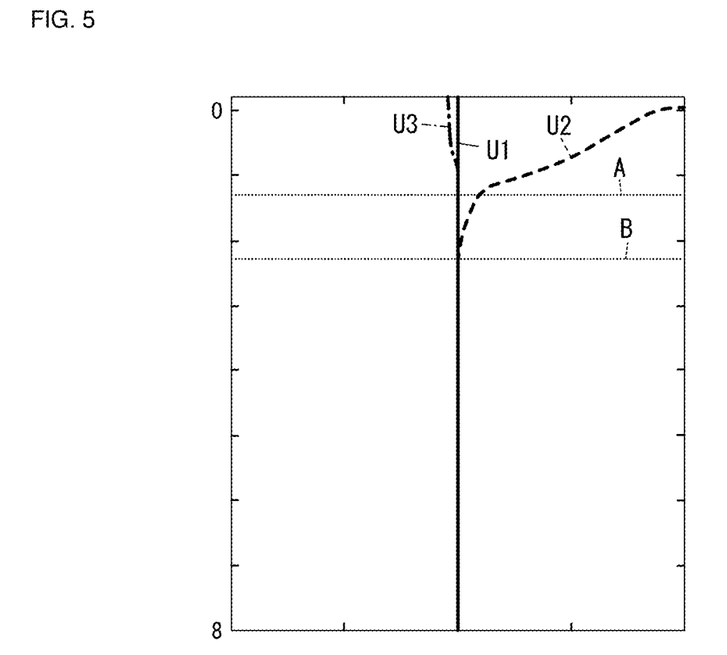
FIG. 5 is a schematic diagram of the energy distribution of an SH wave, that is a U2 component, which is the main mode of the acoustic wave device when the film thickness of the high acoustic velocity film is about $0.5\lambda$.
Figure 6:
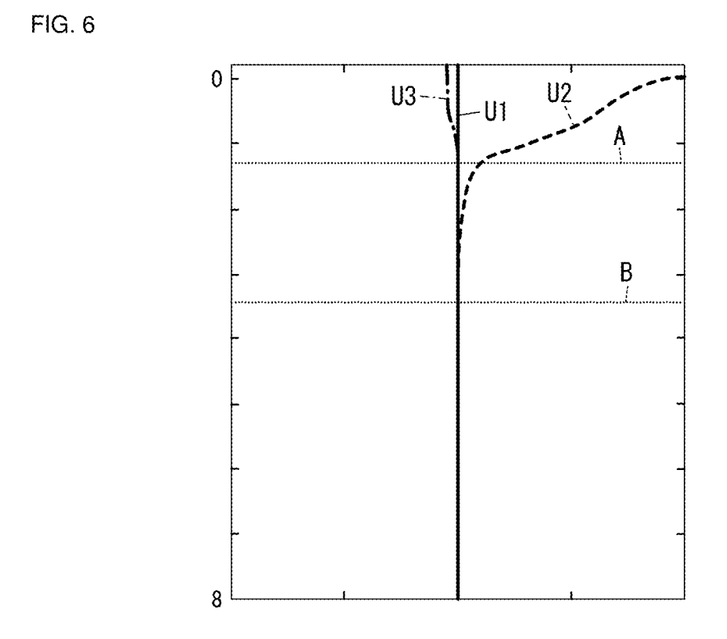
FIG. 6 is a schematic diagram of the energy distribution of an SH wave, that is a U2 component, which is the main mode of the acoustic wave device when the film thickness of the high acoustic velocity film is about $1.0\lambda$.
Figure 7:
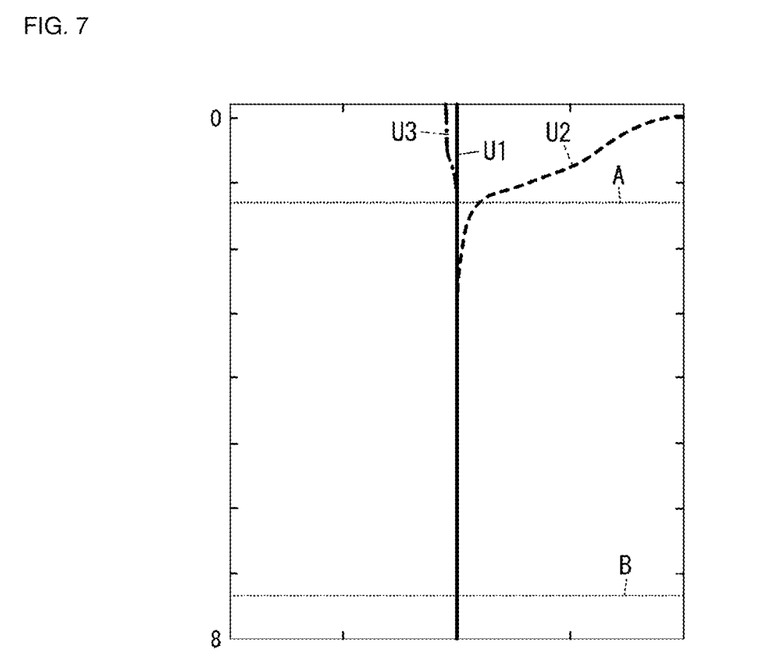
FIG. 7 is a schematic diagram of the energy distribution of an SH wave, that is a U2 component, which is the main mode of the acoustic wave device when the film thickness of the high acoustic velocity film is about $3.0\lambda$.

As shown in FIGS. 5 to 7, when the film thickness of the high acoustic velocity film 32 made of an aluminum nitride film is about 0.5λ or more, the energy of the U2 component, that is, the SH wave is well confined above the lower surface of the high acoustic velocity film 32. Whereas, as is clear in FIG. 4, when the film thickness of the high acoustic velocity film 32 made of an aluminum nitride film is about 0.2λ, the U2 component, which is the main mode to be used, leaks downward relative to the lower surface of the high acoustic velocity film 32. Accordingly, in the acoustic wave device 1, the energy of the main mode, that is, the energy of the acoustic wave to be used is likely to leak to the side of the silicon substrate 2 when the film thickness of the high acoustic velocity film 32 is less than about 0.5λ. Note that the acoustic wave device 1 exhibits the same or substantially the same tendency as in FIGS. 4 to 7 even in a case that a silicon nitride film is used as the high acoustic velocity film 32.

Here, since the thickness of the low acoustic velocity film 31 in the acoustic wave device 1 is about 0.335λ (approximately 0.34λ), it is understood that the main mode is likely to leak to the side of the silicon substrate 2 under the following condition. The sum of the thickness of the low acoustic velocity film 31 and the thickness of the high acoustic velocity film 32, that is, the distance between the first main surface 21 of the silicon substrate 2 and the piezoelectric layer 4 in the thickness direction D1 of the silicon substrate 2 is shorter than about 0.84λ. The more the leakage amount of the main mode is, the more likely the level of the harmonic distortion becomes large. For example, when the distance between the first main surface 21 of the silicon substrate 2 and the piezoelectric layer 4 in the thickness direction D1 of the silicon substrate 2 is shorter than about 0.84λ, the harmonic distortion becomes significant, and therefore, the present invention may more usefully be applied.

(5) Summary

The acoustic wave device 1 according to Preferred Embodiment 1 includes the silicon substrate 2, the piezoelectric layer 4, and the IDT electrode 5. The silicon substrate 2 includes the first main surface 21 and the second main surface 22 opposed to each other. The piezoelectric layer 4 includes the first main surface 41 and the second main surface 42 opposed to each other. The piezoelectric layer 4 is provided on or above the first main surface 21 of the silicon substrate 2. The IDT electrode 5 is provided on the first main surface 41 of the piezoelectric layer 4. The IDT electrode 5 includes the plurality of first electrode fingers 53 and the plurality of second electrode fingers 54. The first main surface 41 of the piezoelectric layer 4 is the main surface of the piezoelectric layer 4 opposite to the side of the silicon substrate 2. The second main surface 42 of the piezoelectric layer 4 is the main surface of the piezoelectric layer 4 on the side of the silicon substrate 2. When the wavelength of the acoustic wave determined by the electrode finger pitch P1 of the IDT electrode 5 is denoted as λ, the distance between the first main surface 21 of the silicon substrate 2 and the second main surface 42 of the piezoelectric layer 4 in the thickness direction D1 of the silicon substrate 2 is shorter than about 0.84λ. The first main surface 21 of the silicon substrate 2 is rougher than the first main surface 41 of the piezoelectric layer 4. With this, it becomes possible in the acoustic wave device 1 according to Preferred Embodiment 1 to reduce or prevent the harmonic distortion.

Preferred Embodiment 2

Figure 8:
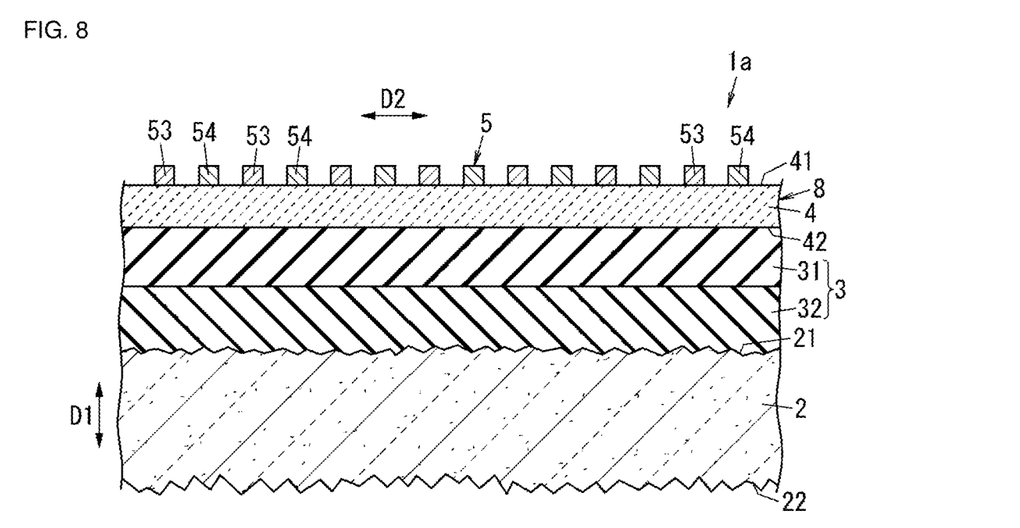
FIG. 8 is a sectional view of an acoustic wave device according to Preferred Embodiment 2 of the present invention.

An acoustic wave device 1a according to Preferred Embodiment 2 of the present invention will be described with reference to FIG. 8. With regard to the acoustic wave device 1a according to Preferred Embodiment 2, the same or substantially the same elements as those of the acoustic wave device 1 according to Preferred Embodiment 1 are denoted by the same reference signs, and the description thereof will be omitted.

The acoustic wave device 1a according to Preferred Embodiment 2 differs from the acoustic wave device 1 according to Preferred Embodiment 1 in that the second main surface 22 of the silicon substrate 2 is roughened.

In the acoustic wave device 1a according to Preferred Embodiment 2, the second main surface 22 of the silicon substrate 2 is rougher than the first main surface 41 of the piezoelectric layer 4. With this, it becomes possible in the acoustic wave device 1a according to Preferred Embodiment 2 to further reduce or prevent the harmonic distortion.

In the acoustic wave device 1a according to Preferred Embodiment 2, the surface roughness of the first main surface 21 of the silicon substrate 2 is smaller than the surface roughness of the second main surface 22 of the silicon substrate 2. The surface roughness of the first main surface 21 of the silicon substrate 2 is about 20 nm or more in maximum height roughness, for example. The surface roughness of the second main surface 22 of the silicon substrate 2 is preferably large from the viewpoint of reducing or preventing the harmonic distortion (third harmonic distortion, for example). For example, the surface roughness is about 115 nm or more in maximum height roughness.

Figure 9:
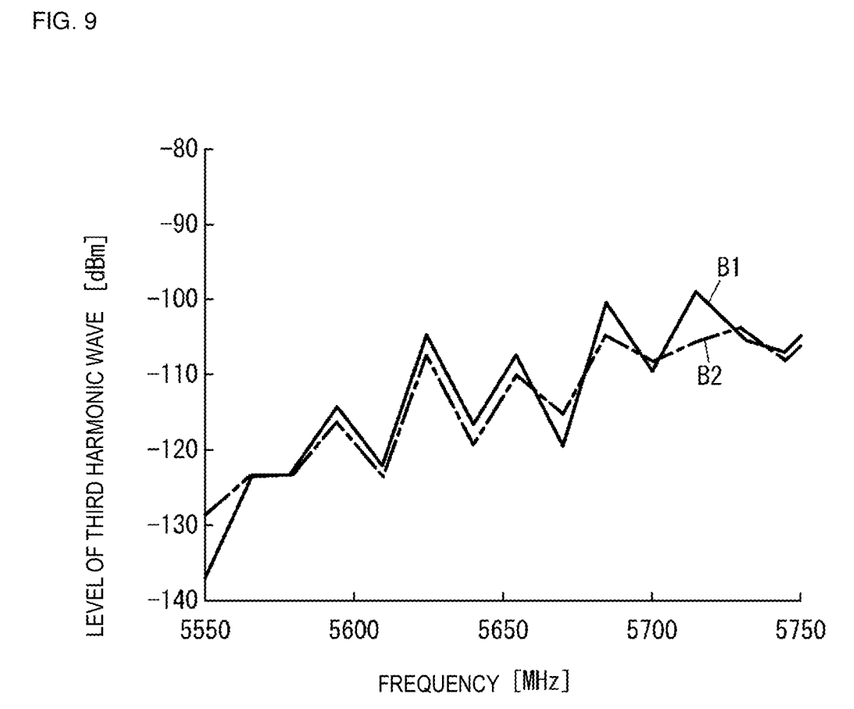
FIG. 9 is a characteristics diagram of the acoustic wave device according to Preferred Embodiment 2 and the acoustic wave device according to Preferred Embodiment 1 of the present invention.

FIG. 9 illustrates the waveform of a third harmonic wave when about +15 dBm electric power is inputted to each of the acoustic wave device 1a according to Preferred Embodiment 2 and the acoustic wave device 1 according to Preferred Embodiment 1. In FIG. 9, the horizontal axis represents frequency, and the vertical axis represents the level of the third harmonic wave [dBm]. In FIG. 9, the waveform of the third harmonic wave of the acoustic wave device 1 according to Preferred Embodiment 1 is indicated by a solid line B1, and the waveform of the third harmonic wave of the acoustic wave device 1a according to Preferred Embodiment 2 is indicated by a dashed-and-dotted line B2. From FIG. 9, it is seen that the acoustic wave device 1a according to Preferred Embodiment 2 is able to reduce the response generated in about 5680 MHz to about 5730 MHz in comparison with the acoustic wave device 1 according to Preferred Embodiment 1.

In the acoustic wave device 1a according to Preferred Embodiment 2, the surface roughness of the second main surface 22 of the silicon substrate 2 is, for example, about 115 nm or more in maximum height roughness. This makes it possible to further reduce or prevent the harmonic distortion.

In the acoustic wave device 1a according to Preferred Embodiment 2, when the wavelength of the acoustic wave determined by the electrode finger pitch P1 of the IDT electrode 5 is denoted as λ, the thickness of the silicon substrate 2 may be, for example, about 3λ or less.

Figure 10:
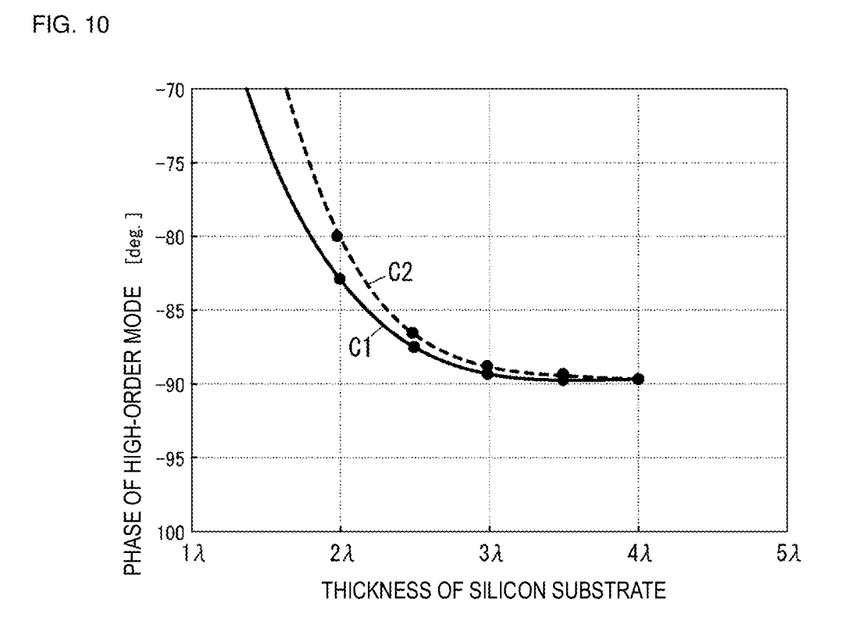
FIG. 10 is a characteristics diagram when a thickness of the silicon substrate is varied in the acoustic wave device according to Preferred Embodiment 2 of the present invention and the acoustic wave device according to a comparative example.

FIG. 10 is a graph of the relationship between the thickness of the silicon substrate 2 and the phase of the high-order mode in each of the acoustic wave device 1a according to Preferred Embodiment 2 and the acoustic wave device according to the above-described comparative example (the acoustic wave device in which the surface roughness of the first main surface 21 of the silicon substrate 2 is equal or substantially equal to or less than the surface roughness of the first main surface 41 of the piezoelectric layer 4). In FIG. 10, the relationship between the thickness of the silicon substrate 2 and the phase of the high-order mode in the acoustic wave device 1a according to Preferred Embodiment 2 is indicated by a solid line C1, and the relationship between the thickness of the silicon substrate and the phase of the high-order mode in the acoustic wave device according to the comparative example is indicated by a broken line C2. From FIG. 10, it is seen that when the thickness of the silicon substrate 2 is greater than about 3λ, the phase of the high-order mode is approximately −90° and the high-order mode is not substantially generated, whereas when the thickness of the silicon substrate 2 is about 3λ or less, the phase of the high-order mode is greater than about −90° and the high-order mode is likely to be generated. Further, from FIG. 10, it is seen that when the thickness of the silicon substrate 2 is about 3λ or less, the acoustic wave device 1a according to Preferred Embodiment 2 reduces or prevents the high-order mode (absolute value of the phase of the high-order mode is larger) relative to the acoustic wave device according to the comparative example.

Accordingly, in the acoustic wave device 1a according to Preferred Embodiment 2, setting the thickness of the silicon substrate 2 to about 3λ or less makes it possible to reduce or prevent the high-order mode spurious response that is generated when the thickness of the silicon substrate 2 is about 3λ or less.

Figure 11:
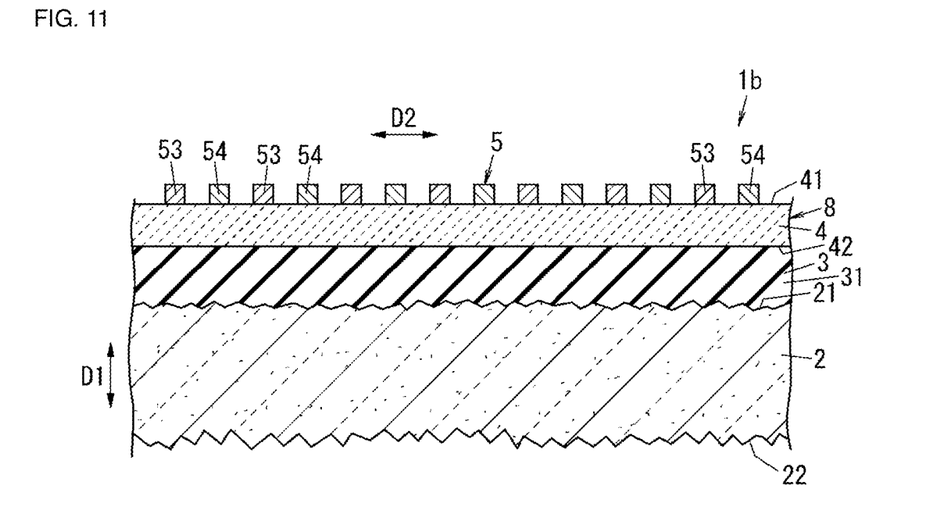
FIG. 11 is a sectional view of an acoustic wave device according to Modification 1 of Preferred Embodiment 2 of the present invention.

Next, an acoustic wave device 1b according to Modification 1 of Preferred Embodiment 2 will be described with reference to FIG. 11. With regard to the acoustic wave device 1b according to Modification 1 of Preferred Embodiment 2, the same or substantially the same elements as those of the acoustic wave device 1a according to Preferred Embodiment 2 are denoted by the same reference signs, and the description thereof will be omitted.

The acoustic wave device 1b according to Modification 1 of Preferred Embodiment 2 differs from the acoustic wave device 1a according to Preferred Embodiment 2 in that the high acoustic velocity film 32 in the acoustic wave device 1a according to Preferred Embodiment 2 is not included. That is, in the acoustic wave device 1b according to Modification 1 of Preferred Embodiment 2, the dielectric film 3 includes only the low acoustic velocity film 31. Here, the low acoustic velocity film 31 is directly provided on the first main surface 21 of the silicon substrate 2.

In the acoustic wave device 1b according to Modification 1 of Preferred Embodiment 2, each of the first main surface 21 and the second main surface 22 of the silicon substrate 2 is rougher than the first main surface 41 of the piezoelectric layer 4 as in the acoustic wave device 1a according to Preferred Embodiment 2. This makes it possible to reduce or prevent the harmonic distortion.

Figure 12:
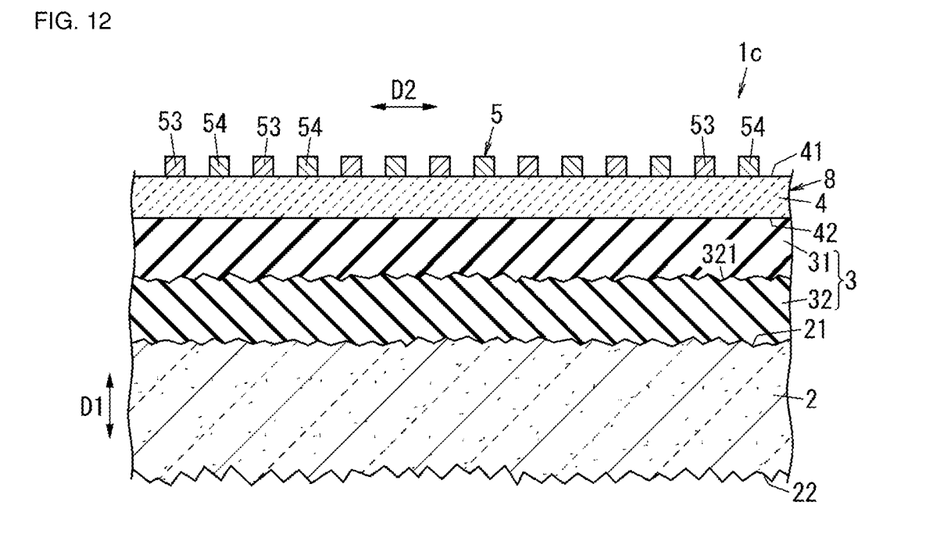
FIG. 12 is a sectional view of an acoustic wave device according to Modification 2 of Preferred Embodiment 2 of the present invention.

Next, an acoustic wave device 1c according to Modification 2 of Preferred Embodiment 2 will be described with reference to FIG. 12. With regard to the acoustic wave device 1c according to Modification 2 of Preferred Embodiment 2, the same or substantially the same elements as those of the acoustic wave device 1a according to Preferred Embodiment 2 are denoted by the same reference signs, and the description thereof will be omitted.

The acoustic wave device 1c according to Modification 2 of Preferred Embodiment 2 differs from the acoustic wave device 1a according to Preferred Embodiment 2 in that a surface 321 of the high acoustic velocity film 32 (main surface of the high acoustic velocity film 32 on the side of the low acoustic velocity film 31) of the acoustic wave device 1a according to Preferred Embodiment 2 is rougher than the first main surface 41 of the piezoelectric layer 4. That is, in the acoustic wave device 1c according to Modification 2 of Preferred Embodiment 2, the surface roughness of not only the first main surface 21 and the second main surface 22 of the silicon substrate 2 but also the surface 321 of the high acoustic velocity film 32 is larger than the surface roughness of the first main surface 41 of the piezoelectric layer 4.

In the acoustic wave device 1c according to Modification 2 of Preferred Embodiment 2, each of the first main surface 21 and the second main surface 22 of the silicon substrate 2 is rougher than the first main surface 41 of the piezoelectric layer 4 as in the acoustic wave device 1a according to Preferred Embodiment 2. This makes it possible to reduce or prevent the harmonic distortion. Further, in the acoustic wave device 1c according to Modification 2 of Preferred Embodiment 2, the surface 321 of the high acoustic velocity film 32 is rougher than the first main surface 41 of the piezoelectric layer 4. This makes it possible to further reduce or prevent the harmonic distortion.

The above-described Preferred Embodiment 1, Preferred Embodiment 2, and the like are merely examples of various preferred embodiments of the present invention. The above-described Preferred Embodiment 1, Preferred Embodiment 2, and the like may be modified in various ways in accordance with the design and the like, as long as one or more of the advantageous effects of the present invention can be achieved.

For example, in the acoustic wave device 1 according to Preferred Embodiment 1 or the acoustic wave device 1a according to Preferred Embodiment 2, the piezoelectric layer 4 may be directly provided on the first main surface 21 of the silicon substrate 2 without including the dielectric film 3.

Further, the acoustic wave devices 1, 1a, 1b, and 1c may include, for example, at least one of a film interposed between the dielectric film 3 and the silicon substrate 2, and a film interposed between the dielectric film 3 and the piezoelectric layer 4.

The following preferred embodiments and modifications thereof are disclosed in this description.

An acoustic wave device (1; 1a; 1b; 1c) according to a preferred embodiment of the present invention includes a silicon substrate (2), a piezoelectric layer (4), and an IDT electrode (5). The silicon substrate (2) includes a first main surface (21) and a second main surface (22) opposed to each other. The piezoelectric layer (4) includes a first main surface (41) and a second main surface (42) opposed to each other. The piezoelectric layer (4) is provided on or above the first main surface (21) of the silicon substrate (2). The IDT electrode (5) is provided on the first main surface (41) of the piezoelectric layer (4). The IDT electrode (5) includes a plurality of first electrode fingers (53) and a plurality of second electrode fingers (54). The first main surface (41) of the piezoelectric layer (4) is opposite to a side of the silicon substrate (2). The second main surface (42) of the piezoelectric layer (4) is on the side of the silicon substrate (2). When a wavelength of an acoustic wave determined by an electrode finger pitch (P1) of the IDT electrode (5) is denoted as $\lambda$, a distance between the first main surface (21) of the silicon substrate (2) and the second main surface (42) of the piezoelectric layer (4) in a thickness direction (D1) of the silicon substrate (2) is less than about $0.84\lambda$. The first main surface (21) of the silicon substrate (2) is rougher than the first main surface (41) of the piezoelectric layer (4).

In the acoustic wave device (1; 1a; 1b; 1c) according to the above-described preferred embodiment, it is possible to reduce or prevent harmonic distortion.

In an acoustic wave device (1a; 1b; 1c) according to a preferred embodiment of the present invention, the second main surface (22) of the silicon substrate (2) is rougher than the first main surface (41) of the piezoelectric layer (4).

In the acoustic wave device (1a; 1b; 1c) according to the above-described preferred embodiment, it is possible to further reduce or prevent the harmonic distortion.

In an acoustic wave device (1a; 1b; 1c) according to a preferred embodiment of the present invention, surface roughness of the first main surface (21) of the silicon substrate (2) is smaller than surface roughness of the second main surface (22) of the silicon substrate (2).

In the acoustic wave device (1a; 1b; 1c) according to the above-described preferred embodiment, it is possible to reduce or prevent the excessive increase of the surface roughness of the first main surface (21) of the silicon substrate (2). This makes it easy to manufacture the acoustic wave device (1a; 1b; 1c) without reducing bondability in a case that the piezoelectric layer (4) is bonded to the side of the first main surface (21) of the silicon substrate (2), for example.

In an acoustic wave device (1; 1a; 1b; 1c) according to a preferred embodiment of the present invention, the material for the piezoelectric layer (4) is lithium tantalate.

An acoustic wave device (1; 1a; 1b; 1c) according to a preferred embodiment of the present invention further includes a dielectric film (3). The dielectric film (3) is provided between the silicon substrate (2) and the piezoelectric layer (4).

In an acoustic wave device (1; 1a; 1b; 1c) according to a preferred embodiment of the present invention, the dielectric film (3) includes a low acoustic velocity film (31). In the low acoustic velocity film (31), an acoustic velocity of a bulk wave propagating along the low acoustic velocity film (31) is lower than an acoustic velocity of a bulk wave propagating along the piezoelectric layer (4).

In the acoustic wave device (1; 1a; 1b; 1c) according to the above-described preferred embodiment, it is possible to reduce loss and to increase a Q factor in comparison with a case that the low acoustic velocity film (31) is not provided.

In an acoustic wave device (1; 1a; 1b; 1c) according to a preferred embodiment of the present invention, the material for the low acoustic velocity film (31) includes silicon oxide.

In the acoustic wave device (1; 1a; 1b; 1c) according to the above-described preferred embodiment, it is possible to reduce temperature coefficients of frequency (TCF).

In an acoustic wave device (1; 1a; 1c) according to a preferred embodiment of the present invention, the dielectric film (3) further includes a high acoustic velocity film (32). The high acoustic velocity film (32) is provided between the silicon substrate (2) and the low acoustic velocity film (31). In the high acoustic velocity film (32), an acoustic velocity of a bulk wave propagating along the high acoustic velocity film (32) is higher than an acoustic velocity of an acoustic wave propagating along the piezoelectric layer (4).

In the acoustic wave device (1; 1a; 1c) according to the above-described preferred embodiment, it is possible to reduce or prevent the leakage of acoustic waves to the silicon substrate (2), and to increase the Q factor.

In an acoustic wave device (1; 1a; 1c) according to a preferred embodiment of the present invention, the material for the high acoustic velocity film (32) includes silicon nitride.

In an acoustic wave device (1; 1a; 1b; 1c) according to a preferred embodiment of the present invention, the surface roughness of the first main surface (21) of the silicon substrate (2) is about 20 nm or more in maximum height roughness.

In the acoustic wave device (1; 1a; 1b; 1c) according to the above-described preferred embodiment, setting the surface roughness of the first main surface (21) of the silicon substrate (2) to about 20 nm or more in maximum height roughness makes it possible to further reduce or prevent the harmonic distortion.

In an acoustic wave device (1; 1a; 1b; 1c) according to a preferred embodiment of the present invention, the surface roughness of the first main surface (21) of the silicon substrate (2) is about 80 nm or less in maximum height roughness.

In the acoustic wave device (1; 1a; 1b; 1c) according to the above-described preferred embodiment, it is possible to reduce or prevent a decrease in flatness of the first main surface (21) of the silicon substrate (2). This makes it easy to reduce or prevent a decrease in bondability in a case that the piezoelectric layer (4) is bonded to the side of the first main surface (21) of the silicon substrate (2), for example.

In an acoustic wave device (1a; 1b; 1c) according to a preferred embodiment of the present invention, the surface roughness of the second main surface (22) of the silicon substrate (2) is about 115 nm or more in maximum height roughness.

In the acoustic wave device (1a; 1b; 1c) according to the above-described preferred embodiment, it is possible to further reduce or prevent the harmonic distortion.

In an acoustic wave device (1; 1a; 1b; 1c) according to a preferred embodiment of the present invention, a thickness of the silicon substrate (2) is about 3λ or less.

In an acoustic wave device (1c) according to a preferred embodiment of the present invention, a main surface (surface 321) of the high acoustic velocity film (32) on the side of the low acoustic velocity film (31) is rougher than the first main surface (41) of the piezoelectric layer (4).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a silicon substrate including a first main surface and a second main surface opposed to each other;
   a piezoelectric layer including a first main surface and a second main surface opposed to each other and provided on or above the first main surface of the silicon substrate;
   a dielectric film between the silicon substrate and the piezoelectric layer; and
   an IDT electrode on the first main surface of the piezoelectric layer and including a plurality of first electrode fingers and a plurality of second electrode fingers; wherein
   the first main surface of the piezoelectric layer is opposite to a side of the silicon substrate;
   the second main surface of the piezoelectric layer is on the side of the silicon substrate;
   when a wavelength of an acoustic wave determined by an electrode finger pitch of the IDT electrode is denoted as λ, a distance between the first main surface of the silicon substrate and the second main surface of the piezoelectric layer in a thickness direction of the silicon substrate is less than about 0.84 λ;
   the first main surface of the silicon substrate is rougher than the first main surface of the piezoelectric layer; and
   the second main surface of the silicon substrate is rougher than the first main surface of the piezoelectric layer.

2. The acoustic wave device according to claim 1, wherein the dielectric film includes a low acoustic velocity film in which an acoustic velocity of a bulk wave propagating along the low acoustic velocity film is lower than an acoustic velocity of a bulk wave propagating along the piezoelectric layer.

3. The acoustic wave device according to claim 2, wherein the dielectric film further includes a high acoustic velocity film between the silicon substrate and the low acoustic velocity film, and in which an acoustic velocity of a bulk wave propagating along the high acoustic velocity film is higher than an acoustic velocity of an acoustic wave propagating along the piezoelectric layer.

4. The acoustic wave device according to claim 3, wherein a material for the high acoustic velocity film includes silicon nitride.

5. The acoustic wave device according to claim 3, wherein a main surface of the high acoustic velocity film on a side of the low acoustic velocity film is rougher than the first main surface of the piezoelectric layer.

6. The acoustic wave device according to claim 2, wherein a material for the low acoustic velocity film includes silicon oxide.

7. The acoustic wave device according to claim 1, wherein a surface roughness of the first main surface of the silicon substrate is less than a surface roughness of the second main surface of the silicon substrate.

8. The acoustic wave device according to claim 7, wherein a material for the piezoelectric layer is lithium tantalate.

9. The acoustic wave device according to claim 1, wherein a material for the piezoelectric layer is lithium tantalate.

10. The acoustic wave device according to claim 1, wherein a surface roughness of the first main surface of the silicon substrate is about 20 nm or more in maximum height roughness.

11. The acoustic wave device according to claim 1, wherein a surface roughness of the first main surface of the silicon substrate is about 80 nm or less in maximum height roughness.

12. The acoustic wave device according to claim 1, wherein a surface roughness of the second main surface of the silicon substrate is about 115 nm or more in maximum height roughness.

13. An acoustic wave device, comprising:
    a silicon substrate including a first main surface and a second main surface opposed to each other;
    a piezoelectric layer including a first main surface and a second main surface opposed to each other and provided on or above the first main surface of the silicon substrate;
    a dielectric film between the silicon substrate and the piezoelectric layer; and
    an IDT electrode on the first main surface of the piezoelectric layer and including a plurality of first electrode fingers and a plurality of second electrode fingers; wherein a thickness of the silicon substrate is about 3 λ or less;
    the first main surface of the piezoelectric layer is opposite to a side of the silicon substrate;
    the second main surface of the piezoelectric layer is on the side of the silicon substrate;
    when a wavelength of an acoustic wave determined by an electrode finger pitch of the IDT electrode is denoted as λ, a distance between the first main surface of the silicon substrate and the second main surface of the piezoelectric layer in a thickness direction of the silicon substrate is less than about 0.84 λ; and
    the first main surface of the silicon substrate is rougher than the first main surface of the piezoelectric layer.

14. The acoustic wave device according to claim 13, wherein the second main surface of the silicon substrate is rougher than the first main surface of the piezoelectric layer.

15. The acoustic wave device according to claim 13, wherein a material for the piezoelectric layer is lithium tantalate.

16. The acoustic wave device according to claim 13, wherein the dielectric film includes a low acoustic velocity film in which an acoustic velocity of a bulk wave propagating along the low acoustic velocity film is lower than an acoustic velocity of a bulk wave propagating along the piezoelectric layer.

17. The acoustic wave device according to claim 16, wherein the dielectric film further includes a high acoustic velocity film between the silicon substrate and the low acoustic velocity film, and in which an acoustic velocity of a bulk wave propagating along the high acoustic velocity film is higher than an acoustic velocity of an acoustic wave propagating along the piezoelectric layer.

18. The acoustic wave device according to claim 17, wherein a main surface of the high acoustic velocity film on a side of the low acoustic velocity film is rougher than the first main surface of the piezoelectric layer.

19. The acoustic wave device according to claim 13, wherein a surface roughness of the first main surface of the silicon substrate is less than a surface roughness of the second main surface of the silicon substrate.

20. The acoustic wave device according to claim 13, wherein
- a surface roughness of the first main surface of the silicon substrate is about 20 nm or more in maximum height roughness; and
- a surface roughness of the second main surface of the silicon substrate is about 115 nm or more in maximum height roughness.

\* \* \* \* \*